(12) United States Patent
Aratake

(10) Patent No.: US 7,531,945 B2
(45) Date of Patent: May 12, 2009

(54) QUARTZ CRYSTAL VIBRATOR, OSCILLATOR AND ELECTRONIC APPARATUS

(75) Inventor: Kiyoshi Aratake, Chiba (JP)

(73) Assignee: Seiko Instruments Inc., Chiba (JP)

( * ) Notice: Subject to any disclaimer, the term of this patent is extended or adjusted under 35 U.S.C. 154(b) by 107 days.

(21) Appl. No.: 11/505,693

(22) Filed: Aug. 17, 2006

(65) Prior Publication Data

US 2007/0046151 A1   Mar. 1, 2007

(30) Foreign Application Priority Data

Aug. 26, 2005   (JP) .............................. 2005-245684

(51) Int. Cl.
*H01L 41/08* (2006.01)
(52) U.S. Cl. .................. 310/344; 310/363; 310/364
(58) Field of Classification Search ............... 310/344, 310/348, 340, 370
See application file for complete search history.

(56) References Cited

U.S. PATENT DOCUMENTS

| | | | | |
|---|---|---|---|---|
| 4,293,986 | A * | 10/1981 | Kobayashi et al. | 29/25.35 |
| 4,362,961 | A * | 12/1982 | Gerber | 310/370 |
| 4,652,787 | A * | 3/1987 | Zingg | 310/344 |
| 6,274,968 | B1 * | 8/2001 | Wajima et al. | 310/348 |
| 6,531,806 | B1 * | 3/2003 | Daidai | 310/344 |
| 6,606,772 | B1 * | 8/2003 | Nohara et al. | 29/25.35 |
| 6,839,243 | B2 * | 1/2005 | Kotani et al. | 361/790 |

FOREIGN PATENT DOCUMENTS

JP   2003-264447   9/2003

* cited by examiner

*Primary Examiner*—Mark Budd
(74) *Attorney, Agent, or Firm*—Brinks Hofer Gilson & Lione

(57) ABSTRACT

To provide a quartz crystal vibrator, an oscillator and an electronic apparatus capable of preventing a bonding electrode from being corroded and easily maintaining soundness of the bonding electrode over a long period of time, a quartz crystal vibrator is provided with a quartz crystal vibrating plate formed by surrounding a quartz crystal vibrating piece by a frame-like portion, a hermetically closed vessel including a lid member and a base member in a plate-like shape for interposing the quartz crystal vibrating plate in a thickness direction, bonding electrodes provided between the lid member and the quartz crystal vibrating plate and between the base member and the quartz crystal vibrating plate and electrically connected to an inner electrode, and a protecting film for protecting the bonding electrode, provided with a recess portion recessed to an inner side of the hermetically closed vessel from an outer edge portion between the lid member and the quartz crystal vibrating plate and an outer edge portion between the base member and the quartz crystal vibrating plate, the protecting film is provided at the recess portion and the bonding electrode is disposed on the inner side of the recess portion.

13 Claims, 7 Drawing Sheets

QUARTZ CRYSTAL VIBRATOR, OSCILLATOR AND ELECTRONIC APPARATUS

This application claims priority under 35 U.S.C. §119 to Japanese Patent Application No. JP2005-245684 filed Aug. 26, 2005, the entire content of which is hereby incorporated by reference.

BACKGROUND OF THE INVENTION

1. Field of the Invention

The present invention relates to a quartz crystal vibrator, an oscillator and an electronic apparatus.

2. Description of the Related Art

In recent years, various quartz crystal vibrators are utilized in a portable telephone or a portable information terminal apparatus as a time source, a timing source of a control signal and the like. In the quartz crystal vibrators, there is a quartz crystal vibrating plate formed by surrounding a quartz crystal vibrating piece by a frame-like portion, and a hermetically closed vessel constituted by interposing the quartz crystal vibrating plate by a lid member and a base member in a plate-like shape in a thickness direction. The quartz crystal vibrators are fabricated, for example, as follows. That is, a bonding electrode comprising aluminum or the like is formed on an outer face of a wafer for constituting a quartz crystal vibrating plate, and the quartz crystal vibrating plate is interposed by two of wafers for constituting the lid member and the base member. Thereafter, the respective wafers are anodically bonded by applying a predetermined voltage to each of the wafers, successively, cut to constitute the quartz crystal vibrators one by one by a dicing step.

Here, when the bonded wafers are cut, end portions of the bonding electrodes are exposed from side faces of the hermetically closed vessels. The bonding electrode comprises a member having a low corrosion resistance of aluminum or the like and therefore, when the end portion is made to stay to be exposed to outside air, the bonding electrode is corroded. When corrosion is brought about, leakage is brought about, the atmosphere starts to flow into a cavity portion formed inside of the hermetically closed vessel by a small amount and a pressure of the cavity portion is changed. As a result, an oscillation frequency and a resonance resistance value of the quartz crystal vibrator are varied by rectified values or more. Hence, in order to prevent the variations, it is well known to form a fluororesin layer for covering to protect the end portion of the bonding electrode at the side face of the hermetically closed vessel (refer to JP-A-2003-264447).

However, according to the above-described constitution, a strength of the fluororesin layer against an external force is insufficient and therefore, there is a concern of bringing about chipping or the like at the fluororesin layer by some factor. Further, although it is conceivable to form the fluororesin layer to be thick in order to increase the strength, when the fluororesin layer is made to be thick, crack or the like is brought about at the fluororesin layer by a stress produced by expansion, contraction or the like by a change in a temperature of outside air. When such a chipping or crack or the like is brought about, outside air or moisture invades from a clearance of the chipping or the crack and the bonding electrode is corroded.

SUMMERY OF THE INVENTION

The invention has been carried out in view of such a situation and it is an object thereof to provide a quartz crystal vibrator, an oscillator and an electronic apparatus capable of preventing a bonding electrode from being corroded and easily maintaining soundness of the bonding electrode over a long period of time.

In order to resolve the above-described problem, the invention provides the following means.

According to the invention, there is provided a quartz crystal vibrator comprising a quartz crystal vibrating plate formed by surrounding a quartz crystal vibrating piece by a frame-like portion, an inner electrode provided at the quartz crystal vibrating piece for applying a voltage to the quartz crystal vibrating piece, a hermetically closed vessel including a lid member and a base member in a plate-like shape for interposing the quartz crystal vibrating plate in a thickness direction thereof, bonding electrodes for bonding provided between the lid member and the quartz crystal vibrating plate and between the base member and the quartz crystal vibrating plate and electrically connected to the inner electrode, and a protecting film provided at an outer face of the hermetically closed vessel for protecting the bonding electrode, wherein recess portions recessed to inner sides of the hermetically closed vessel are provided at an outer edge portion between the lid member and the quartz crystal vibrating plate and between the base member and the quartz crystal vibrating plate, the protecting film is provided at the recess portion, and wherein the bonding electrode is disposed on the inner side of the recess portion.

In the quartz crystal vibrator according to the invention, the bonding electrode is disposed on the inner side of the protecting film and therefore, the bonding electrode is protected without being exposed to outside air. Further, since the protecting film is provided at the recess portion recessed to the inner side, a strength of the protecting film to the inner side is increased, not only chipping or the like can be prevented from being brought about but also even when crack or the like is brought about at the protecting film, the crack can be prevented from reaching an end portion on the inner side.

Further, according to the invention, there is provided the quartz crystal vibrator further comprising an auxiliary electrode electrically connected to the bonding electrode and having a corrosion resistance higher than a corrosion resistance of the bonding electrode, wherein the auxiliary electrode is extended to the outer edge portion between the lid member and the quartz crystal vibrating plate and the outer edge portion between the base member and the quartz crystal vibrating plate.

In the quartz crystal vibrator according to the invention, the auxiliary electrode having the corrosion resistance higher than the corrosion resistance of the bonding electrode is electrically connected to the bonding electrode and is extended to the outer edge portion.

Here, in fabricating the quartz crystal vibrator, it is general to summarizingly fabricate a plurality of the quartz crystal vibrators by utilizing a wafer. That is, the plurality of quartz crystal vibrators are continuously formed in row and column directions by overlapping a plurality of wafers. Further, the plurality of wafers are anodically bonded. That is, respective upper and lower wafers for constituting the lid member and the base member are applied with, for example, a negative voltage and the bonding electrode is applied with a positive voltage reverse thereto by an outside voltage applying apparatus or the like. At this occasion, the bonding electrode of one quartz crystal vibrator is disposed on the inner side of the recess portion and therefore, the bonding electrode of one quartz crystal vibrator is not connected to the bonding electrode of other quartz crystal vibrator contiguous in row and column directions and respective bonding electrodes are brought into a state of being insulated in singles of the quartz crystal vibrators. Therefore, although the bonding electrodes of the quartz crystal vibrators disposed at an edge of the wafer can be applied with voltage by respectively being connected to an electrode terminal of the voltage applying apparatus or the like, the bonding electrodes of the quartz crystal vibrators disposed on the inner side of the wafer cannot be connected with the electrode terminal.

According to the invention, since the auxiliary electrode is extended to the edge portion, the respective auxiliary electrodes are brought into a state of being electrically connected to other auxiliary electrodes contiguous in row and column directions. Further, since the respective auxiliary electrodes are electrically connected to the respective bonding electrodes, by only connecting the external electrode terminal to one point of the auxiliary electrode, the voltage can be applied to all of the bonding electrodes on the wafer by way of the auxiliary electrode. Therefore, the plurality of quartz crystal vibrators can efficiently and easily be fabricated. Further, since the corrosion resistance of the auxiliary electrode is higher than that of the bonding electrode, the auxiliary electrode can be prevented from being corroded by being brought into contact with outside air.

Further, according to the quartz crystal vibrator according to the invention, an opening diameter of the recess portion is set to be larger than a diameter of an inner portion of the recess portion.

In the quartz crystal vibrator according to the invention, the melted protecting film in a liquid state is injected to the recess portion by way of an opening portion. At this occasion, since the opening diameter is set to be large, the protecting film can easily be injected into the recess portion.

Further, according to the invention, there is provided an oscillator, wherein the above-described quartz crystal vibrator according to an aspect of the invention is electrically connected to an integrated circuit as an oscillation piece.

Further, according to the invention, there is provided an electronic apparatus including the above-described quartz crystal vibrator according to an aspect of the invention.

In the oscillator and the electronic apparatus according to the invention, an effect similar to that of the above-described quartz crystal vibrator according to an aspect of the invention can be achieved.

According to the invention, not only chipping or the like can be prevented from being brought about at the protecting film but also even when crack is brought about at the protecting film, the crack can be prevented from reaching the end portion of the inner side and therefore, the bonding electrode can be prevented from being corroded and soundness of the bonding electrode can easily be maintained over a long period of time. Further, since the boding electrode is prevented from being corroded, leakage is not brought about, a change in a pressure of the cavity portion formed at the inside of the hermetically closed vessel is restrained and variations in the oscillation frequency and the resonance resistance value of the quartz crystal vibrator are maintained within rectified values for a long period of time.

DESCRIPTION OF THE PREFERRED EMBODIMENTS

Embodiment 1

A quartz crystal vibrator according to a first embodiment of the invention will be explained in reference to the drawings as follows.

Figure 1:
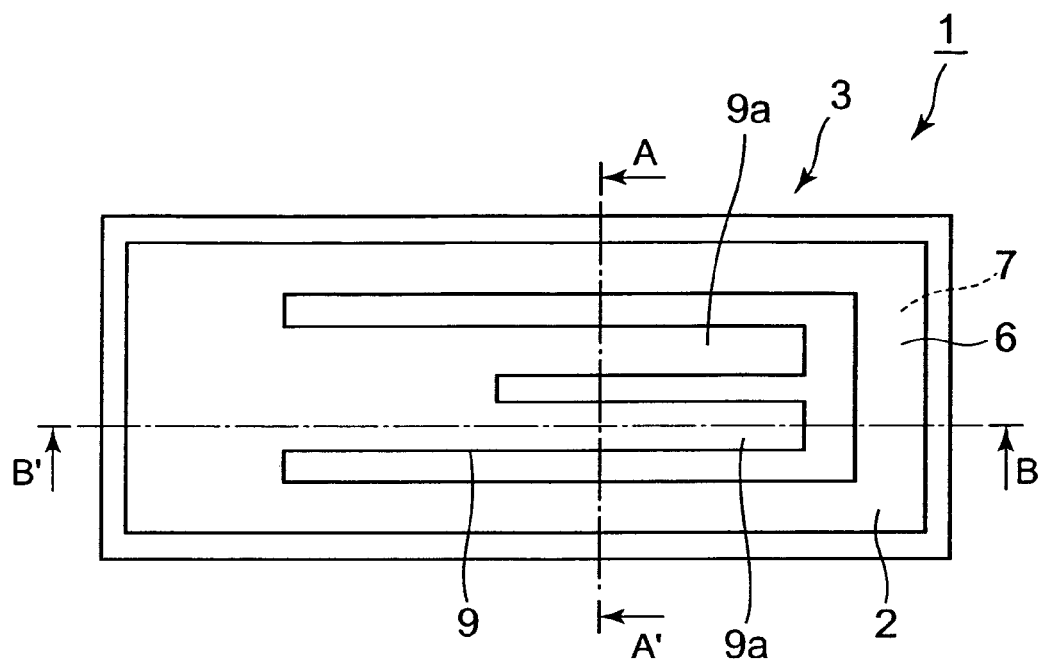
FIG. 1 is a plane view showing a quartz crystal vibrator according to a first embodiment of the invention.

In FIG. 1, notation 1 designates a quartz crystal vibrator.

The quartz crystal vibrator 1 includes a quartz crystal vibrating plate 2 comprising quartz and formed by a rectangular shape, and a hermetically closed vessel 3 having a lid member 6 and a base member 7 in a plate-like shape for interposing the quartz crystal vibrating plate 2 in a thickness direction.

Figure 2:
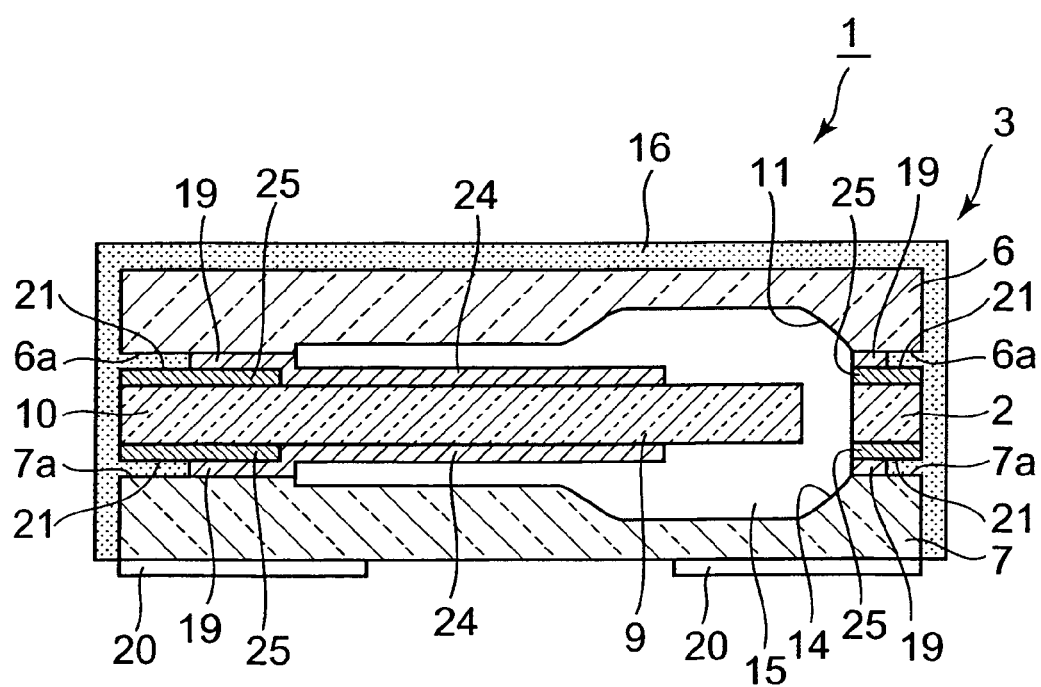
FIG. 2 is a sectional view taken along a line B-B of FIG. 1.
Figure 3:
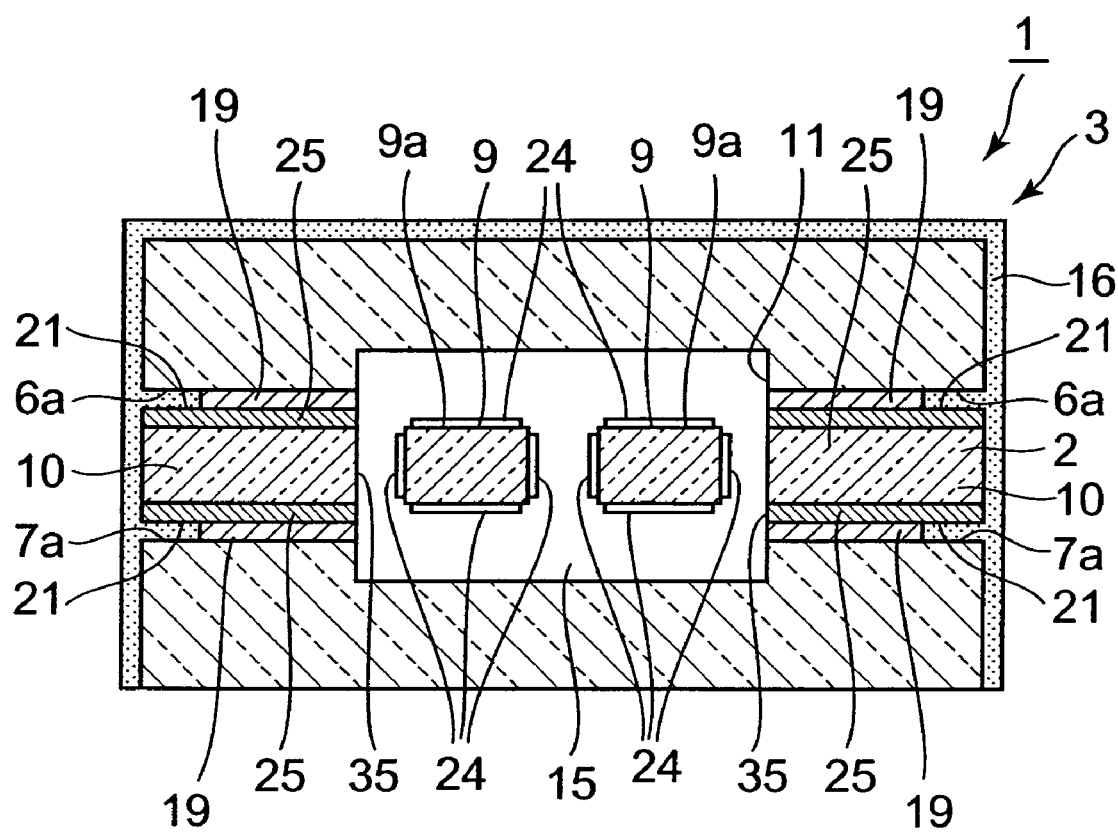
FIG. 3 is a sectional view taken along a line A-A of FIG. 1.

The quartz crystal vibrating plate 2 includes a quartz crystal vibrating piece 9 of a tuning fork type in which two of vibrating arms 9a extended in parallel with each other are integrally connected on respective base end sides thereof, and a frame-like portion 10 (shown in FIG. 4) in a shape of a rectangular frame surrounding the quartz crystal vibrating piece 9. The quartz crystal vibrating piece 9 and the frame-like portion 10 are integrally formed by way of a base end portion of the quartz crystal vibrating piece 9. As shown by FIG. 2 and FIG. 3, an outer face of the quartz crystal vibrating piece 9 is formed with an inner electrode 24 for applying a voltage to the quartz crystal vibrating piece 9. The inner electrode 24 comprises an electrically conductive member of, for example, aluminum or the like. Further, by applying a voltage to the quartz crystal vibrating piece 9 by way of the inner electrode 24, the quartz crystal vibrating piece 9 is vibrated at a predetermined frequency. Further, although in FIG. 2 and FIG. 3, the inner electrode 24 is shown to be simplified, actually, the inner electrode 24 is naturally patterned in accordance with various specifications or shapes.

Further, in two main faces of the lid member 6, one main face 6a is formed with a lid side recess portion 11 substantially in a rectangular shape. Similarly, a one main face 7a of the base member 7 is formed with a base side recess portion 14 substantially in a rectangular shape. Further, the lid member 6 and the base member 7 are bonded by overlapping the one main face 6a the other main face 7a with the quartz crystal vibrating plate 2 interposed therebetween in a state in which the lid side recess portion 11 and the base side recess portion 14 are opposed to each other. In this way, by making the lid side recess portion 11 and the base side recess portion 14 opposed to each other, a cavity portion 15 is formed inside of the hermetically closed vessel 3, and the quartz crystal vibrating piece 9 is permitted to vibrate by the cavity portion 15.

Inside of the hermetically closed vessel 3 is sealed in airtight and the cavity portion 15 is maintained in a vacuum state.

Further, an outer peripheral face of the hermetically closed vessel 3 is formed with a protecting film 16 excluding a bottom face (other main face of the base member 7). The protecting film 16 comprises 0.1 wt % fluorocarbon of a fluorine species coating agent having trimethyl siloxane at a terminus thereof. As the protecting film 16, for example, OPTOOL DSX (product name: made by Daikin Industries, Ltd.) or the like is used.

Further, bonding electrodes 19 comprising electrically conductive members of, for example, aluminum or the like are provided respectively between the lid member 6 and the quartz crystal vibrating plate 2 and between the base member 7 and the quartz crystal vibrating plate 2. The bonding electrodes 19 are for bonding the lid member 6 and the base member 7, and the quartz crystal vibrating plate 2 and function as lead-out electrodes for extending the inner electrode 24 to the frame-like portion 10. That is, the bonding electrode 19 is integrally formed with the inner electrode 24 and is electrically connected to the inner electrode 24. Further, the bonding electrode 19 is electrically connected with an external terminal 20 provided at the bottom face of the hermetically closed vessel 3. The external terminal 20 is constituted by forming an Au layer on a Cr layer formed as a matrix.

Further, according to the embodiment, there are provided recess portions 21 recessed to inner sides of the hermetically closed vessel 3 from entire peripheries of an outer edge portion between the lid member 6 and the quartz crystal vibrating plate 2 and an outer edge portion between the base member 7 and the quartz crystal vibrating plate 2. That is, the bonding electrodes 19 formed at the frame-like portion 10 are formed by excluding the whole peripheries of outer edge portions of the two main faces of the quartz crystal vibrating plate 2 and the two outer edge portions which are not provided with the bonding electrodes 19 are constituted as the recessed portions 21. Therefore, the bonding electrode 19 is disposed on the inner side of the hermetically closed vessel 3 of the recess portion 21. Further, the recess portion 21 is filled with the above-described protecting film 16.

Further, according to the embodiment, matrix electrodes (auxiliary electrodes) 25 are formed between the bonding electrode 19 and the one main face of the quartz crystal vibrating plate 2 (frame-like portion 10) and between the bonding electrode 19 and the other main face of the quartz crystal vibrating plate 2 (frame-like portion 10). The matrix electrode 25 comprises a member having a corrosion resistance higher than that of the bonding electrode 19, for example, a conductive material of Cr, Ti, Ni, W (tungsten) or the like. The matrix electrodes 25 are electrically connected to the respective bonding electrodes 19 inside of the hermetically closed vessel 3 and respectively extended to the outer edge portions.

Further, the lid member 6 and the base member 7 comprise glass of, for example, soda lime glass or the like and the lid member 6 and the base member 7 are anodically bonded by way of the matrix electrode 25 and the bonding electrode 19.

Next, a method of fabricating the quartz crystal vibrator 1 according to the embodiment will be explained.

Figure 4:
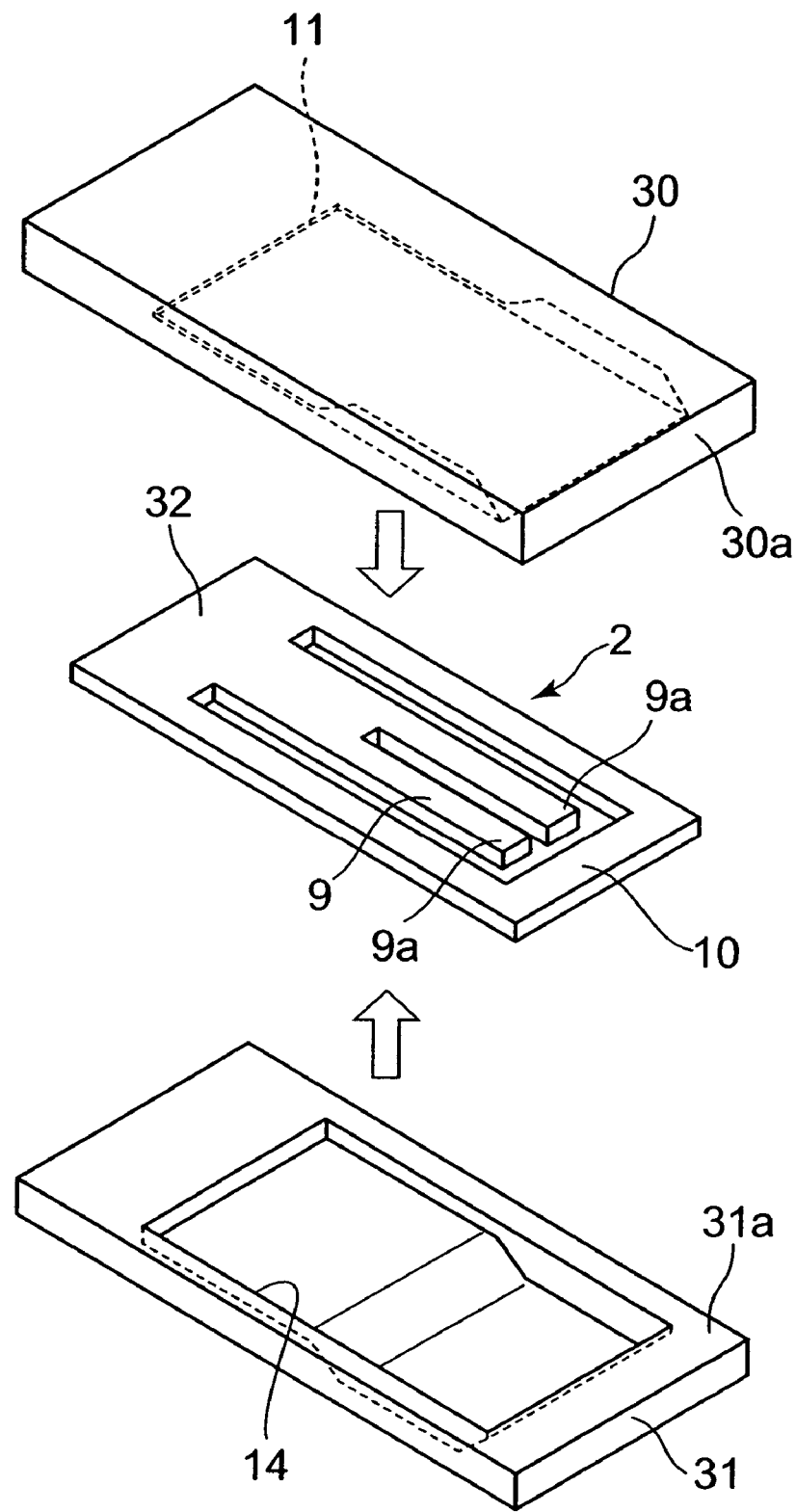
FIG. 4 is an explanatory view showing a behavior of fabricating the quartz crystal vibrator of FIG. 1.

First, the lid member 6 and the base member 7 are machined to form. That is, as shown by FIG. 4, a wafer 30 for the lid portion comprising glass is polished to a predetermined thickness and cleaned. Further, a work altered layer at the topmost surface is removed by etching or the like. Further, a plurality of the lid side recess portions 11 are formed in one main face 30a of the wafer 30 for the lid portion by etching or the like. Further, although in FIG. 4, only one of the lid side recess portion 11 is clearly shown for simple explanation, actually, the plurality of lid side recess portions 11 are formed continuously in row and column directions over the entire one main face 30a of the wafer 30 of the lid portion. That is, a plurality of the lid members 6 are aligned to be integrally formed into the wafer 30 for the lid portion, and here, the wafer 30 for the lid portion corresponds to the lid member 6. Further, the one main face 30a of the wafer 30 for the lid portion corresponds to the one main face 6a of the lid member 6.

Further, the base member 7 is machined to form. That is, similar to the lid member 6, a plurality of the base side recess portions 14 are formed at one main face 31a of a wafer 31 for the base comprising glass. Also in this case, the wafer 31 for the base corresponds to the base member 7, and the one main face 31a of the wafer 31 for the base corresponds to the one main face 7a of the base member 7.

Successively, through holes, not illustrated, are provided at each of four corners of a rectangle when each of the base side recess portions 14 is formed into a rectangle of a predetermined size.

Further, by subjecting a quartz crystal wafer 32 to etching or the like, pluralities of the tuning fork type quartz crystal vibrating pieces 9 and the frame-like portion 10 are integrally machined to form. Also here, the quartz crystal wafer 32 corresponds to the quartz crystal vibrating plate 2.

Figure 5:
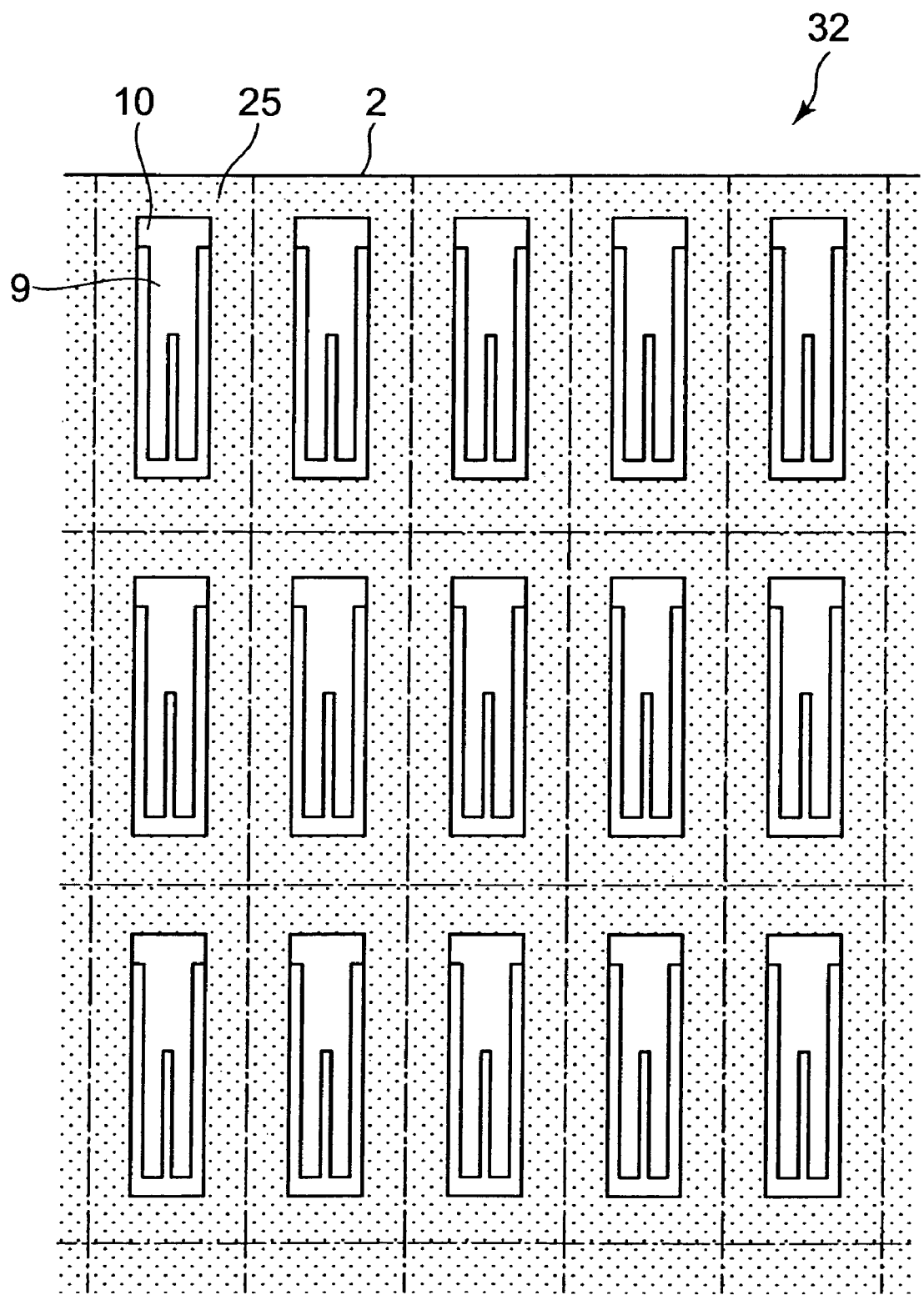
FIG. 5 is an explanatory view enlarging an essential portion of a quartz wafer of FIG. 4.

Further, after forming a matrix electrode layer over the entire face of the quartz crystal wafer 32 by sputtering, vapor deposition or the like, patterning is carried out by photolithography and etching or the like to remove the matrix electrode layer of an inner side face 35 of the frame-like portion 10, the vibrating arm 9a and the like. The matrix electrode layer patterned in this way constitutes the above-described matrix electrode 25. The matrix electrodes 25 are formed over entire two faces of the frame-like portion 10 and extended to the outer edge portion of the frame-like portion 10. Therefore, as shown by FIG. 5, the matrix electrode 25 is integrally formed with the plurality of the quartz crystal vibrating plates 2 in row and column directions and all of the matrix electrodes 25 on the quartz crystal wafer 32 come into an electrically conducted state.

Further, a layer of aluminum is formed at a total of the quartz crystal vibrating plate 2 from above the matrix electrode 25 by sputtering, vapor deposition or the like. Further, patterning is carried out by photolithography and etching or the like, an electrode comprising aluminum is formed at the vibrating arm 9a, and the aluminum layer at an unnecessary portion of the inner side face 35 of the frame-like portion 10, an outer edge portion of each quartz crystal vibrating plate 2 or the like is removed. At this occasion, the electrode patterned at the vibrating arm 9a constitutes the inner electrode 24 and the electrode patterned at the frame-like portion 10 constitutes the bonding electrode 19. Further, the portion of the outer edge portion removing the aluminum layer and exposing the matrix electrode 25 constitutes the above-described recess portion 21.

Next, in vacuum, as shown by FIG. 4, the respective wafers are overlapped to interpose the quartz crystal wafer 32 by the wafer 30 for the lid portion and the wafer 31 for the base in the thickness direction. At this occasion, the lid side recess portion 11 and the base side recess portion 14 are opposed to each other respectively, thereby, the cavity portion 15 is formed.

Under the state, the respective wafers are heated to a predetermined temperature. Along therewith, by an outside voltage applying apparatus or the like, a negative voltage is applied to the wafer 30 for the lid portion and the wafer 31 for the base, and positive voltage is applied to the matrix electrode 25. At this occasion, since all of the matrix electrodes 25 are electronically conducted on the quartz crystal wafer 32, the voltage is applied to all of the matrix electrodes 25 by constituting one point of an external electrode terminal brought into contact with the matrix electrode 25. Further, the voltage is applied to the bonding electrodes 19 by way of the matrix electrodes 25. As a result, electrostatic attraction forces are produced between the bonding electrode 19 and the one main face 30a and between the bonding electrode 19 and the one main face 31a to strongly bring the both members into close contact with each other to be bonded anodically. Thereby, the cavity portions 15 are sealed in airtight and the hermetically closed vessels 3 contiguous in row and column directions are formed. Thereafter, the respective voltages are stopped, and the wafer 30 for the lid portion and the wafer 31 for the base are gradually cooled to return to room temperature. During a time period in which temperatures of the wafer 30 for the lid portion, the wafer 31 for the base and the quartz crystal vibrating plate 2 or the like are elevated and return to normal temperature, the wafer 30 for the lid portion, the wafer 31 for the base and the quartz crystal vibrating plate 2 are thermally expanded by elevating the temperatures, contracted by being cooled gradually and returned to the original state. At this occasion, since thermal expansion coefficients of glass and quartz differ from each other, amounts of deforming the respective wafers differ from each other and therefore, it is not preferable to elevate the temperatures excessively. Therefore, when the glass is soda lime glass, as the bonding electrode 19, aluminum capable of carrying out anodic bonding even at a temperature equal to or lower than 300° C. is used.

Thereafter, the external terminals 20 are provided at the respective hermetically closed vessels 3. That is, a thin film is formed by sputtering, vapor deposition or the like at other main face of the wafer 31 for the base by providing a metal mask thereon. Thereby, a pair of the external terminals 20 extended from the inner face of the through hole to the other main face of the wafer 31 for the base are provided. The external terminal 20 is connected to the bonding electrode 19 by way of the through hole.

Further, the wafer 30 for the lid portion and the wafer 31 for the base or the like are cut in a state of pasting a tape on the other main face of the wafer 31 for the base. That is, the wafer 30 for the lid portion and the wafer 31 for the base and the like are installed at a dicing saw and are cut on straight lines connecting the through holes by a dicing blade in row and column directions. Thereby, the matrix electrode 25 is exposed from a side face of the hermetically closed vessel 3. At this occasion, the bonding electrode 19 is brought into a state of being disposed on an inner side of the recess portion 21.

Further, a total of the wafer 30 for the lid portion and the wafer 31 for the base and the like is dipped into the solution of fluorocarbon in a state of being pasted to the tape. Thereafter, the wafer 30 for the lid portion and the wafer 31 for the base and the like are taken out, placed for a predetermined time period and thereafter heated. Then, the protecting film 16 is formed at outer faces of the respective hermetically closed vessels 3 and the recess portions 21. Further, although there is a case in which the solution invades a clearance of the tape when the respective wafers are dipped, since a surface of the external terminal 20 comprises Au and the solution comprises fluorocarbon, the protecting film is prevented from being formed at the external terminal 20.

Thereafter, when the tape is exfoliated, singles of the quartz crystal vibrators 1 become the quartz crystal vibrators 1 shown in FIG. 1 through FIG. 3.

Next, operation of the quartz crystal vibrator 1 according to the embodiment constituted in this way will be explained.

When a predetermined voltage is applied to the external terminal 20, the voltage is applied to the quartz crystal vibrating piece 9 by way of the bonding electrode 19 and the inner electrode 24. Then, the vibrating arms 9a carry out a flexural movement with a predetermined period in directions of being proximate to each other or remote from each other, that is, by a reverse phase mode by a piezoelectric effect.

Here, in the fluororesin layer or the like as the protecting film of the related art, chipping, crack or the like is liable to be brought about. According to the embodiment, a defect, a crack or the like is prevented from being brought about as follows. There is provided the recess portion 21 recessed to the inner side of the hermetically closed vessel 3 over the entire peripheries of the outer edge portion between the lid member 6 and the quartz crystal vibrating plate 2 and between the base member 7 and the quartz crystal vibrating plate 2, and the recess portion 21 is filled with the protecting film 16. Therefore, a dimension of the protecting film 16 inside of the recess portion 21 extended to the inner side of the hermetically closed vessel 3 becomes sufficiently large. Therefore, a strength of the protecting film 16 inside of the recess portion 21 against an external force is increased, for example, even when the quartz crystal vibrator 1 is pinched by tweezers or the like, the protecting film 16 inside of the recess portion 21 is prevented from being chipped off. Further, crack or the like is difficult to be brought about at the protecting film 16 inside of the recess portion 21, and even when crack is assumedly brought about, the crack becomes difficult to reach the inner side end portion of the protecting film 16 inside of the recess portion 21.

As described above, according to the quartz crystal vibrator 1 according to the embodiment, chipping, crack or the like can be prevented from being brought about at the protecting film 16 inside of the recess portion 21 and therefore, the bonding electrode 19 can be prevented from being corroded and soundness of the bonding electrode 19 can easily be maintained over a long period of time. Further, since the bonding electrode 19 is prevented from being corroded, leakage is not brought about, a change in the pressure of the cavity portion 15 formed inside of the hermetically closed vessel 3 is restrained and variations of the oscillation frequency and the resonance resistance value of the quartz crystal vibrator 1 are maintained within rectified values for a long period of time.

Further, since the frame-like portion 10 is provided with the matrix electrode 25 extended to the outer edge portion, when a plurality of the quartz crystal vibrating plates 2 are formed on the quartz crystal wafer 32, all of the matrix electrodes 25 on the quartz crystal wafer 32 can electrically be connected. Therefore, in anodic bonding, the voltage can be applied to all of the bonding electrodes 19 on the quartz crystal wafer 32 by way of the matrix electrodes 25 by constituting the one point of the external electrode terminal brought into contact with the matrix electrode 25. Therefore, the plurality of quartz crystal vibrators 1 can efficiently and easily be fabricated. Further, since the matrix electrode 25 is provided with the corrosion resistance higher than that of the bonding electrode 19, even when chipping or crack is brought about at the protecting film 16 brought into contact with the matrix electrode 25, the matrix electrode 25 can be prevented from being corroded.

Figure 6:
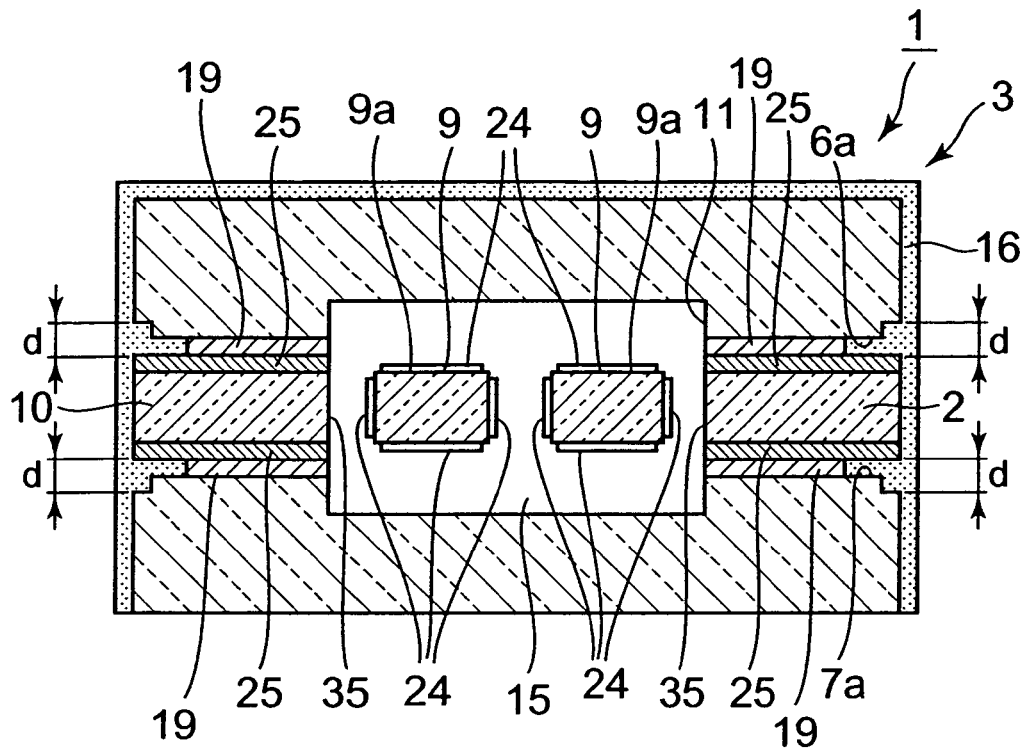
FIG. 6 is a sectional view taken along a line A-A showing a modified example of a recess portion of the quartz crystal vibrator of FIG. 1.

Further, although according to the embodiment, the recess portion 21 is provided and a shape or the like of the recess portion 21 can pertinently be changed. For example, as shown by FIG. 6, an opening diameter d of the recess portion 21 can be set to be larger than a diameter of an inner portion thereof.

Thereby, the solution of fluorocarbon can be facilitated to invade inside of the recess portion 21, and the solution can swiftly be filled fully inside of the recess portion 21.

Embodiment 2

Next, a second embodiment of the invention will be explained.

Figure 7:
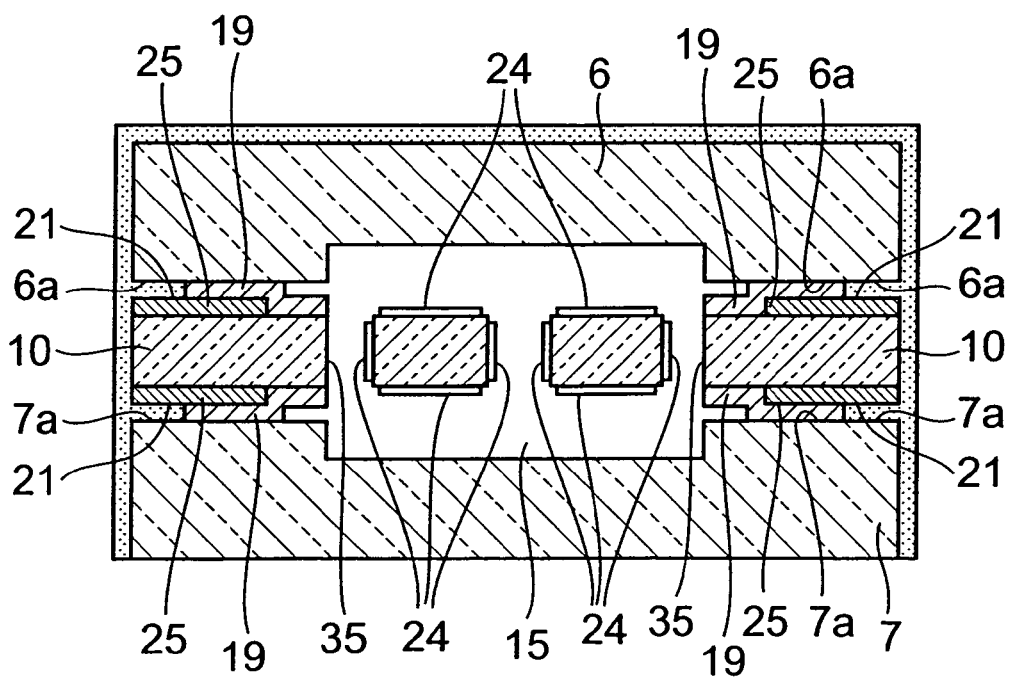
FIG. 7 is a view showing an essential portion of a quartz crystal vibrator according to a second embodiment of the invention and is a sectional view taken along a line A-A in correspondence with FIG. 1.

FIG. 7 shows the second embodiment of the invention.

In FIG. 7, the same portions as constituent elements illustrated in FIG. 1 through FIG. 6 are attached with the same notations and an explanation thereof will be omitted.

Basic constitutions of the embodiment and the first embodiment are the same and an explanation will be given here of a point of difference.

According to the embodiment, the matrix electrode 25 is removed over an entire periphery of an inner edge portion of the frame-like portion 10, and the bonding electrode 19 is extended to the removed portion. That is, the bonding electrode 19 is extended in steps to the inner edge portion of the frame-like portion 10 from each of the one main faces 6a, 7a of the lid member 6 and the base member 7.

Here, when the matrix electrode layer remains at the inner side face 35 of the frame-like portion 10 without being removed therefrom, the bonding electrode 19 on the side of the lid member 6 and the bonding electrode 19 on the side of the base member 7 are short circuited. Hence, in forming the matrix electrode 25, a mask for exposure is prevented from being disposed at the inner edge portion of the frame-like portion 10. Further, the matrix electrode 25 is patterned by overexposure. Therefore, the matrix electrode layer is removed from the inner side face 35 of the frame-like portion 10 over to the inner edge portion. Further, the bonding electrode 19 is formed on the patterned matrix electrode 25 as described above.

Thereby, the matrix electrode layer can be prevented from remaining at the inner side face 35 and yield can be promoted.

Further, although the matrix electrodes 25 are provided over the entire faces of the two faces of the frame-like portion 10, the invention is not limited thereto but a portion, a dimension and a shape or the like of the matrix electrode 25 at the frame-like portion 10 can pertinently be changed. That is, the matrix electrodes 25 may electrically be connected to the bonding electrodes 19 and may electrically be connected to at least portions of the matrix electrodes 25 contiguous to each other in row and column directions on the quartz crystal wafer 32. For example, the matrix electrodes 25 may be formed linearly in row and column directions.

Further, although the matrix electrode 25 is provided, the matrix electrode 25 may be dispensed with. However, it is preferable to provide the matrix electrodes 25 when a plurality of the quartz crystal vibrator 1 are summarizingly fabricated by using a wafer or the like as described above.

Further, although the protecting film 16 comprises optul DSX, the invention is not limited thereto but the member can pertinently be changed.

Further, also members of the bonding electrode 19 and the matrix electrode 25 can pertinently be changed.

Further, although the plurality of quartz crystal vibrators 1 are summarizingly fabricated by the wafer 30 for the lid portion and the wafer 31 for the base, the invention is not limited thereto but the plurality of quartz crystal vibrators 1 may individually be fabricated.

Embodiment 3

Figure 8:
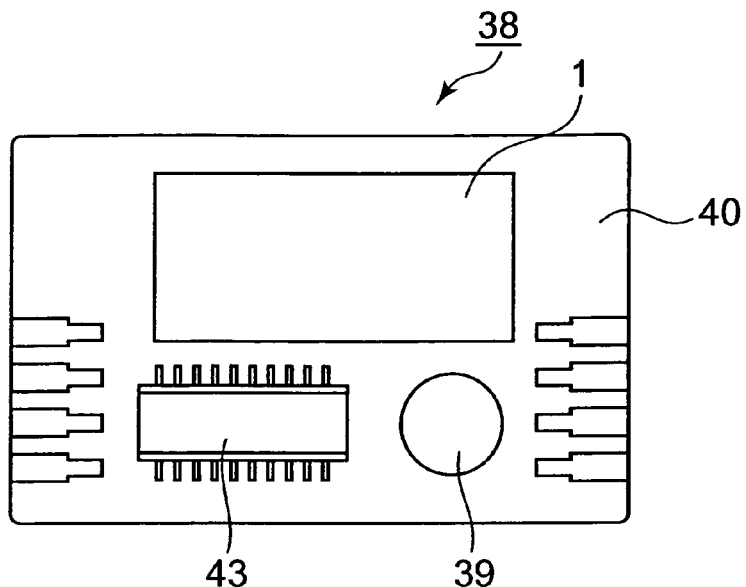
FIG. 8 is a plane view showing an oscillator according to a third embodiment of the invention.

As a third embodiment of the present invention, an oscillator in which the above-mentioned piezoelectric vibrator is connected to an integrated circuit as an oscillation piece is explained in conjunction with FIG. 8.

FIG. 8 is a rough schematic view showing the constitution of a tuning-fork-type quartz crystal oscillator 38.

In FIG. 8, the tuning-fork-type quartz crystal vibrator 1 is set at a given position on a board 40, while an integrated circuit for oscillator indicated by numeral 43 is arranged close to the quartz crystal vibrator. Further, an electronic component 39 such as a capacitor is also mounted on the board 40. These respective parts are electrically connected with each other through a wiring pattern not shown in the drawing. The mechanical vibrations of a piezoelectric vibrator piece of the tuning-fork-type quartz crystal vibrator 1 are converted into electric signals due to the piezoelectric characteristic which the quartz crystal possesses and the electric signals are inputted to the integrated circuit 43. In the inside of the integrated circuit 43, the signal processing is performed and frequency signals are outputted and hence, the integrated circuit 43 functions as an oscillator. These respective constitutional parts are molded by resin not shown in the drawing. By selecting, for example, a RTC (Real Time Clock) module or the like as the integrated circuit 43, the integrated circuit 43 also has, besides a function of a single function oscillator for clock, a function of controlling an operation day and time of the oscillator and an external apparatus and a function of providing information on time and calendar to a user.

In the oscillator according to the invention, an effect similar to that of the above-described piezoelectric vibrator can be achieved. Therefore, the oscillator can be functioned with stable accuracy over a long period of time.

Embodiment 4

Figure 9:
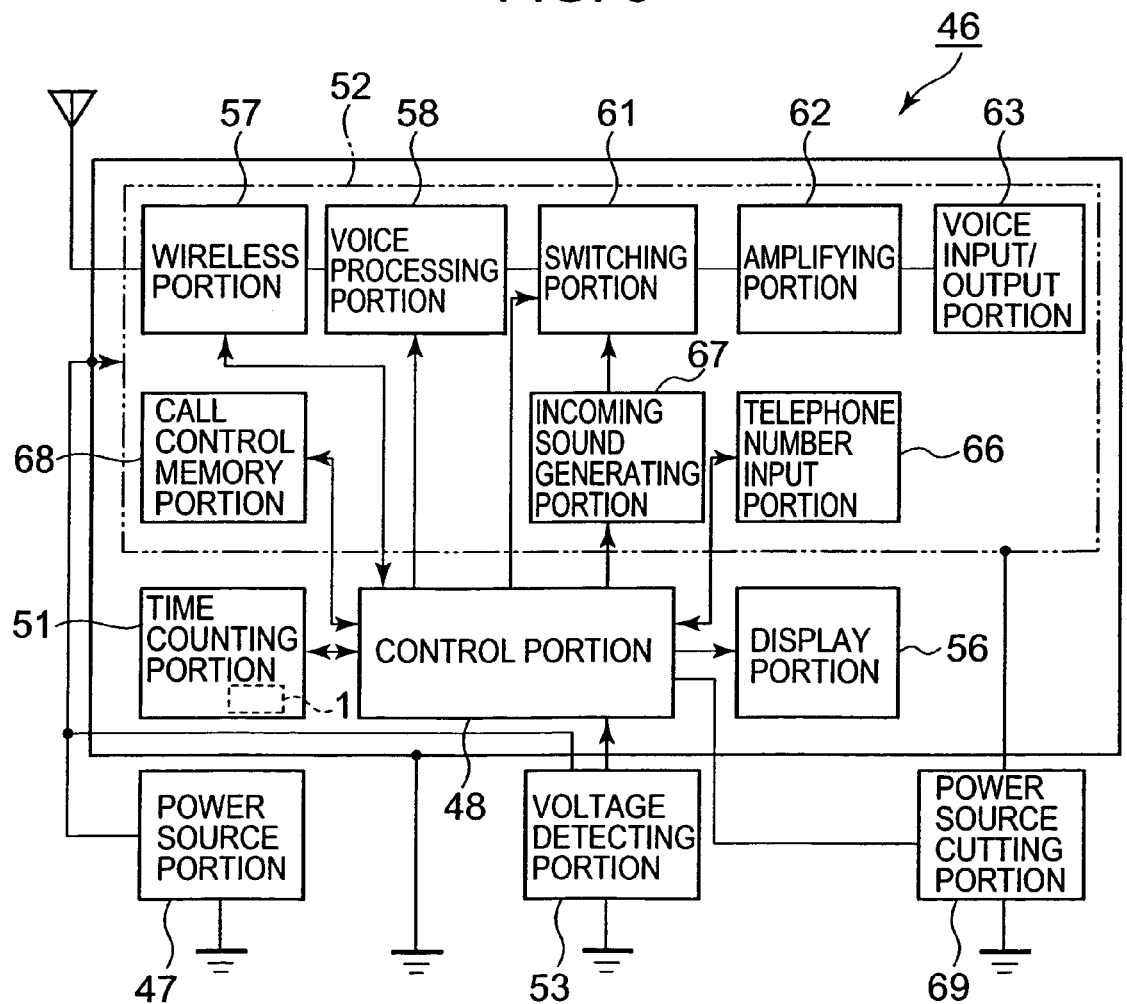
FIG. 9 is a block diagram showing portable information apparatus according to a fourth embodiment of the invention.

As a fourth embodiment of the present invention, an electronic apparatus used in a state that the above-mentioned piezoelectric vibrator is connected to a time counting portion is explained in conjunction with FIG. 9. As an example of the electronic apparatus, a preferred embodiment on a portable information apparatus represented by a mobile phone is explained in detail.

First of all, as a premise, the portable information apparatus according to this embodiment is a development or an improvement of a wrist watch of the related art. The portable information apparatus resembles the wrist watch in appearance, arranges a liquid crystal display on a portion thereof which corresponds to a dial plate, and can display a current time and the like on a screen of the display. In using the portable information apparatus as a communication device, the portable information apparatus is removed from a wrist and a user can perform the communication in the same manner as a mobile phone of the related art using a speaker or a microphone incorporated in the inside of a band portion. However, the portable information apparatus is drastically miniaturized and is light-weighted compared to the conventional mobile phone.

Next, the functional constitution of the portable information apparatus according to this embodiment is explained in conjunction with the drawing. FIG. 9 is a block diagram showing the constitution of the portable information apparatus 46 according to this embodiment functionally.

In FIG. 9, numeral 47 indicates a power source portion which supplies electricity to respective functional parts described later. To be more specific, the power source portion 47 is embodied by a lithium ion secondary cell. To the power source portion 47, a control portion 48, a time counting portion 51, a communication portion 52, a voltage detecting portion 53 and a display portion 56 are connected in parallel to each other, wherein the electricity is supplied to the respective functional parts from the power source portion 47.

The control portion 48 controls the respective functional parts described later and performs an operational control of the whole system such as the transmission and reception of vocal data, the measurement and display of the current time and the like. The control portion 48, to be more specific, is embodied by programs which are preliminarily written in a ROM, a CPU which reads out and executes the programs, a RAM which is used as a work area of the CPU and the like.

A time counting portion 51 is constituted of an integrated circuit which incorporates an oscillation circuit, a register circuit, a counter circuit, an interface circuit and the like therein and the tuning-fork-type quartz crystal vibrator which is described in the embodiment 1 or 2. The mechanical vibrations of the tuning-fork-type quartz crystal vibrator are converted into electric signals due to the piezoelectric characteristic which the quartz crystal possesses and the electric signals are inputted to the oscillation circuit which is constituted of a transistor and a capacitor. An output of the oscillation circuit is binarized and the binarized value is counted by the register circuit and the counter circuit. The transmission and reception of signals are performed between the time counting portion 51 and the control portion 48 through the interface circuit and the current time, the current date or the calendar information is displayed on the display portion 56.

The communication portion 52 functions in the same manner as the mobile phone of the related art and is constituted of a wireless portion 57, a voice processing portion 58, an amplifying portion 62, a voice input/output portion 63, an incoming sound generating portion 67, a switching portion 61, a call control memory portion 68 and a telephone number input portion 66.

The wireless portion 57 transmits and receives various kinds of data such as vocal data with a base station via an antenna. The voice processing portion 58 codes and decodes the vocal signal inputted from the wireless portion 57 or the amplifying portion 62 described later. The amplifying portion 62 amplifies the signal inputted from the voice processing portion 58 or the voice input/output portion 63 described later to a given level. The voice input/output portion 63 is, to be more specific, a speaker or a microphone and amplifies an incoming call sound or a phone sound or collects a speaker's voice.

The incoming sound generating portion 67 generates an incoming call sound in response to calling from the base station. The switching portion 61 changes over the connection between the amplifying portion 62 and the voice processing portion 58 to the connection between the amplifying portion 62 and the incoming call generating portion 67 only at the time of receiving the incoming signal and hence, the generated incoming call sound is outputted to the input/output portion 63 through the amplifying portion 62.

Here, the calling control memory 68 stores a program related to the outgoing/incoming calling control of the communication. Further, the telephone number input portion 66, to be more specific, is constituted of number keys from 0 to 9 and some other keys and is served for inputting the telephone number of a telephone call destination or the like.

The voltage detecting portion 53, when a voltage applied to the respective functional parts including the control portion 48 from the power source portion 47 becomes lower than a given value, detects the lowering of the voltage and notifies the lowering of the voltage to the control portion 48. The given voltage value is a value which is preliminarily set as a minimum voltage for operating the communication portion 52 in a stable manner and is a voltage of approximately 3V, for example. The control portion 48, upon receiving the notification of lowering of the voltage from the voltage detecting portion 53, inhibits the operations of the wireless portion 57, the voice processing portion 58, the switching portion 61 and the incoming sound generating portion 67. Particularly, the stopping of the operation of the wireless portion 57 which exhibits the large power consumption is indispensable. Simultaneously with such stopping of the operations, a message that the communication portion 52 is inoperable due to the shortage of the remaining battery amount is displayed on the display portion 56.

Due to the cooperative operation of the voltage detecting portion 53 and the control portion 48, it is possible to inhibit the operation of the communication portion 52 and it is also possible to display the inhibition of the operation of the communication portion 52 on the display portion 56.

In this embodiment, by providing a power source cutting portion 69 which can selectively interrupt the power supply of a portion corresponding to the function of the communication portion, it is possible to stop the function of the communication portion in a more complete form.

Here, although the display of the message that the communication portion 52 becomes inoperable may be performed using a letter message, the display may be performed by more instinctive methods including a method in which a mark "x" (meaning inoperable) is applied to a telephone icon on the display portion 56.

In the electric apparatus according to the invention, an effect similar to that of the above-described piezoelectric vibrator can be achieved. Therefore, the electric apparatus can be reliable and functioned with stable accuracy over a long period of time.

Embodiment 5

Figure 10:
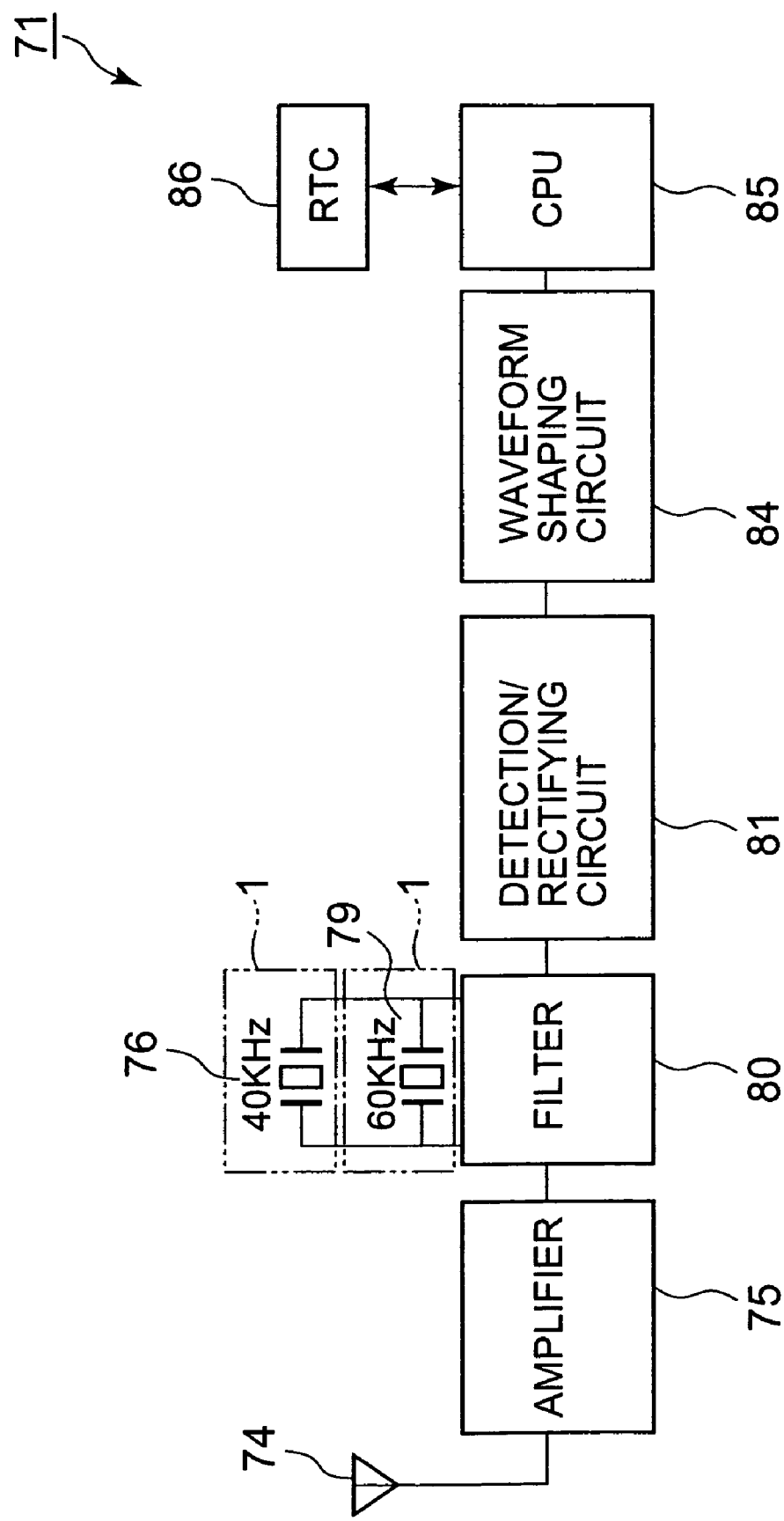
FIG. 10 is a block diagram showing a radio wave timepiece according to a fifth embodiment of the invention.

FIG. 10 is a schematic view showing a circuit block of a radio wave timepiece 71 which constitutes an electronic apparatus according to a fifth embodiment of the present invention. The embodiment shows a case in which the tuning-fork-type quartz crystal vibrator (piezoelectric vibrator) manufactured by the manufacturing method of the present invention is connected to a filter part of the radio wave timepiece 71.

The radio wave timepiece 71 is a clock which has a function of receiving the standard electric wave containing time information and displaying the time information by automatically correcting the time to an accurate time. In Japan, transmission stations (transmitting facilities) which transmit the standard electric waves are located in Fukushima prefecture (40 KHz) and Saga prefecture (60 KHz) and these transmission stations transmit the standard electric waves respectively. Long waves having frequency of 40 KHz or 60 KHz have a property that the long waves are propagated on a surface of the earth and a property that the long waves are propagated while being reflected between an ionosphere and the surface of the earth and hence, the propagation range is broad whereby the long waves cover the whole Japan with the above-mentioned two transmission stations.

In FIG. 10, an antenna 74 receives the standard electric waves formed of the long waves of 40 KHz or 60 KHz. The standard electric waves formed of long waves are electric waves obtained by applying the time information referred to as a time code to the carrier wave of 40 KHz or 60 KHz using the AM modulation.

The received standard electric waves formed of long waves are amplified by an amplifier 75. Subsequently, the standard electric waves are filtered by a filter part 80 containing quartz crystal vibrators 76, 79 having the same resonance frequency as the carrier wave frequency and are synchronized with the carrier wave. The filtered signal of given frequency is detected and demodulated by a detecting/rectifying circuit 81. Then, the time code is taken out through a waveform shaping circuit 84 and is counted by a CPU 85. The CPU 85 reads out the information such as the current year, the accumulated days, date, time and the like. The read-out information is reflected on a RTC 86 and the accurate time information is displayed.

Since the carrier wave is 40 KHz or 60 KHz, it is preferable to use the above-mentioned vibrator having the tuning-fork-type structure as the quartz crystal vibrators 76, 79 which constitute the filter parts respectively. Taking the long waves of 60 KHz, for example, as a size example of the tuning-fork-type vibrator, it is possible to configure the vibrating piece such that the vibrating piece has a total length of approximately 2.8 mm and a width size of a base portion thereof is approximately 0.5 mm.

The piezoelectric vibrator which is manufactured by the manufacturing method of the present invention is connected to the filter part of the radio wave timepiece, thereby making it possible to further improve the endurance of the radio wave timepiece. Accordingly, it is possible to allow the radio wave timepiece to be operated over a long period while maintaining the highly accurate filter function of the radio wave timepiece for a long period.

What is claimed is:

1. A quartz crystal vibrator comprising:
   a quartz crystal vibrating plate formed by surrounding a quartz crystal vibrating piece by a frame-like portion;
   an inner electrode provided at the quartz crystal vibrating piece for applying a voltage to the quartz crystal vibrating piece;
   a hermetically closed vessel including a lid member and a base member in a plate-like shape for interposing the quartz crystal vibrating plate in a thickness direction thereof;
   bonding electrodes for bonding provided between the lid member and the quartz crystal vibrating plate and between the base member and the quartz crystal vibrating plate and electrically connected to the inner electrode; and
   a protecting film provided at an outer face of the hermetically closed vessel for protecting the bonding electrode;
   wherein recess portions recessed to inner sides of the hermetically closed vessel are provided at an outer edge portion between the lid member and the quartz crystal vibrating plate and between the base member and the quartz crystal vibrating plate, the protecting film is provided at the recess portion; and
   wherein the bonding electrode is disposed on the inner side of the recess portion,
   the quartz crystal vibrator further comprising:
   an auxiliary electrode electrically connected to the bonding electrode and having a corrosion resistance higher than a corrosion resistance of the bonding electrode;
   wherein the auxiliary electrode is extended to the outer edge portion between the lid member and the quartz crystal vibrating plate and the outer edge portion between the base member and the quartz crystal vibrating plate.

2. The quartz crystal vibrator according to claim 1, wherein an opening diameter of the recess portion is set to be larger than a diameter of an inner portion of the recess portion.

3. An oscillator, wherein the quartz crystal vibrator according to claim 1 is electrically connected to an integrated circuit as an oscillation piece.

4. An electronic apparatus including the quartz crystal vibrator according to claim 1.

5. A quartz crystal vibrator comprising:
   a quartz piece responsive to application of an electrical signal to vibrate;
   an enclosure configured with two halves which sandwich a part of the quartz piece therebetween to hermetically enclose the quartz piece inside thereof;
   main electrodes patterned over the quartz piece to supply the electrical signal to the quartz piece, the main electrodes extending over the quartz piece and terminating with peripheral portions inside a periphery of the quartz piece, wherein the peripheral portions are sandwiched between the two halves and the quartz piece and each have a thickness sufficiently thick to form a gap between the two halves and the quartz piece; and
   a protective material covering in film at least a part of the enclosure and the quartz piece and filling the gap to prevent exposure of the main electrodes to air, wherein the gap is sufficiently wide and deep such that a self-reinforcing amount of protective material fills the gap, and further wherein the protective material comprises 0.1 wt % fluorocarbon of a fluorine species coating agent having trimethyl siloxane at a terminus thereof.

6. A quartz crystal vibrator according to claim 5, wherein the main electrodes are made of aluminum.

7. A quartz crystal vibrator according to claim 5, further comprising auxiliary electrodes being laid between the two halves and the quartz piece.

8. A quartz crystal vibrator according to claim 7, wherein the auxiliary electrodes are made of a material selected from the group consisting of Cr, Ti, Ni and W.

9. A quartz crystal vibrator according to claim 5, wherein the protective material comprises OPTOOL DSX.

10. A quartz crystal vibrator according to claim 5, wherein the enclosure comprises soda lime glass.

11. A quartz crystal vibrator according to claim 5, wherein the quartz piece comprises a frame and a vibrating piece surrounded by the frame.

12. A quartz crystal vibrator according to claim 11, wherein the two halves sandwich at least a part of the frame.

13. A quartz crystal vibrator according to claim 5, wherein a periphery of at least one of the two halves is formed with a cut-off to increase a volume of the gap.

* * * * *